(12) United States Patent
Watanabe et al.

(10) Patent No.: US 8,778,145 B2
(45) Date of Patent: Jul. 15, 2014

(54) MAGNETIC FIELD CONTROL FOR UNIFORM FILM THICKNESS DISTRIBUTION IN SPUTTER APPARATUS

(75) Inventors: Eisaku Watanabe, Komae (JP); Tetsuro Ogata, Chofu (JP)

(73) Assignee: Canon Anelva Corporation, Kawasaki-shi (JP)

( * ) Notice: Subject to any disclaimer, the term of this patent is extended or adjusted under 35 U.S.C. 154(b) by 270 days.

(21) Appl. No.: 13/116,204

(22) Filed: May 26, 2011

(65) Prior Publication Data

US 2011/0259733 A1 Oct. 27, 2011

Related U.S. Application Data

(63) Continuation of application No. PCT/JP2009/069474, filed on Nov. 17, 2009.

(30) Foreign Application Priority Data

Dec. 29, 2008 (JP) ................................. 2008-335760

(51) Int. Cl.
*C23C 14/35* (2006.01)
(52) U.S. Cl.
USPC ............ 204/192.12; 204/192.13; 204/298.03; 204/298.2
(58) Field of Classification Search
USPC ............... 204/192.12, 192.13, 298.03, 298.2, 204/298.29
See application file for complete search history.

(56) References Cited

U.S. PATENT DOCUMENTS

| 4,927,513 A * | 5/1990 | Schultheiss et al. ..... 204/192.13 |
| 2005/0133365 A1* | 6/2005 | Hong et al. ................ 204/298.2 |
| 2011/0165775 A1 | 7/2011 | Hirayama et al. |

FOREIGN PATENT DOCUMENTS

| JP | 59-104476 A | 6/1984 |
| JP | 2-290971 A | 11/1990 |
| JP | 5-132771 A | 5/1993 |
| JP | 9-176852 A | 7/1997 |
| JP | 2001-158961 A | 6/2001 |
| JP | 2004-162138 A | 6/2004 |

OTHER PUBLICATIONS

Machine Translation of Takagi et al. JP 2001-158961 dated Dec. 12, 2001.*

(Continued)

*Primary Examiner* — Rodney McDonald
(74) *Attorney, Agent, or Firm* — Fitzpatrick, Cella, Harper & Scinto

(57) ABSTRACT

When a film is formed by using a sputter method, distribution variation due to a progress of target erosion generated during the film formation is suppressed, and film thickness distribution and resistance value distribution are corrected to an optimal state. In order to maintain the magnetic flux density formed on the target surface at a constant level, the distance between the target surface and the magnet surface (MT distance) is corrected in accordance with the progress of the target erosion. Further, two or more MT distances are set by a process recipe or the like while forming a thin film, and different distribution shapes are combined to form a near flat distribution shape.

8 Claims, 8 Drawing Sheets

(56) References Cited

OTHER PUBLICATIONS

Written Opinion of the International Searching Authority (PCT/ISA/237) issued in International Application No. PCT/JP2009/069474—3 pages.
International Search Report (PCT/ISA/210) issued in the International Application No. PCT/JP2009/069474—3 pages.
International Preliminary Report on Patentability (PCT/IPEA/409) issued in the International Application No. PCT/JP2009/069474—5 pages.
Wickramanayaka, S., et al., "Magnetically Enhanced Dual Frequency Capacitively Coupled Plasma Source for Large-area Wafer Processing", Japanese Journal of Applied Physics, vol. 37, Part 1, No. 11, pp. 6193-6198 (Nov. 1998).

* cited by examiner

DISTANCE FROM THE CENTER OF SUBSTRATE (mm)

US 8,778,145 B2

MAGNETIC FIELD CONTROL FOR UNIFORM FILM THICKNESS DISTRIBUTION IN SPUTTER APPARATUS

CROSS-REFERENCES TO RELATED APPLICATIONS

This application is a continuation application of International Application No. PCT/JP2009/0699474, filed Nov. 17, 2009, which claims the benefit of Japanese Patent Application No. 2008-335760, filed Dec. 29, 2008. The contents of the aforementioned applications are incorporated herein by reference in their entities.

TECHNICAL FIELD

The present invention relates to a sputter apparatus, in particular, to a sputter apparatus for improving film characteristics represented by film thickness and resistance value distributions that are effective in a sputtering process of metal or dielectric material when manufacturing an integrated circuit or the like.

BACKGROUND ART

For manufacturing electronic components such as semiconductor devices, a magnetically enhanced spatter apparatus is widely used. Conventionally, it is known that a magnet apparatus having various magnet arrangements is disposed on the back side of a target in accordance with purposes such as generating a plasma, confining a plasma, increasing a plasma density, and improving uniformity of film formation (Non Patent Document 1 and Patent Document 1).

Furthermore, in Patent Document 1, a technique is disclosed in which variation of sputtering speed over time is suppressed by adjusting a distance between the magnet apparatus and the target in accordance with variation of a magnetic field on the surface of the target due to erosion (corrosion) of the target member.

PRIOR ART DOCUMENT

Patent Document

Patent Document 1: Japanese Unexamined Patent Application Publication No. 2004-162138

Non-Patent Document

Non-Patent Document 1: S. Wickramanayaka and Y. Nakagawa, "Magnetically Enhanced Dual Frequency Capacitively Coupled Plasma Source for Large-area Wafer Processing," Japan, OYO BUTURI, 37, 1998, page 6193

SUMMARY OF INVENTION

However, in the method of Patent Document 1, even if it is possible to suppress the variation of sputtering speed with the progress of the erosion, the film thickness distribution does not become completely flat and a predetermined distribution is formed reflecting the magnet arrangement or the like. In such a distribution that reflects the magnet arrangement or the like, bias may be large if the emission angle changes for each target material, and thus it is necessary to optimize the magnet arrangement in each case.

The present invention has been made in view of the above problems, and an object of the present invention is to provide a method capable of adjusting a film thickness distribution t desired one.

In view of the above problems, the present invention is characterized by including: a processing chamber in which a body to be processed can be disposed; a cathode to which a target can be attached on a side where the body to be processed is disposed; a magnet apparatus that is located on a side opposite to the side where the target of the cathode is attached and forms a magnetic field on a surface of the target; a drive means capable of adjusting a distance between the magnet apparatus and the target; and a control means for controlling the drive means and a power supply to the cathode, wherein the control means controls the drive means to perform a first control for setting a distance between the magnet apparatus and the target to a first distance and forming a film on the body to be processed by sputtering of the target, and a second control for setting a distance between the magnet apparatus and the target to a second distance in which a distribution pattern of film thickness is different from that when a film is formed in the first distance, and forming a film on the body to be processed by sputtering of the target.

According to the present invention, the film thickness distribution (resistance value distribution) can be adjusted.

DESCRIPTION OF EMBODIMENTS

First Embodiment

Figure 1:
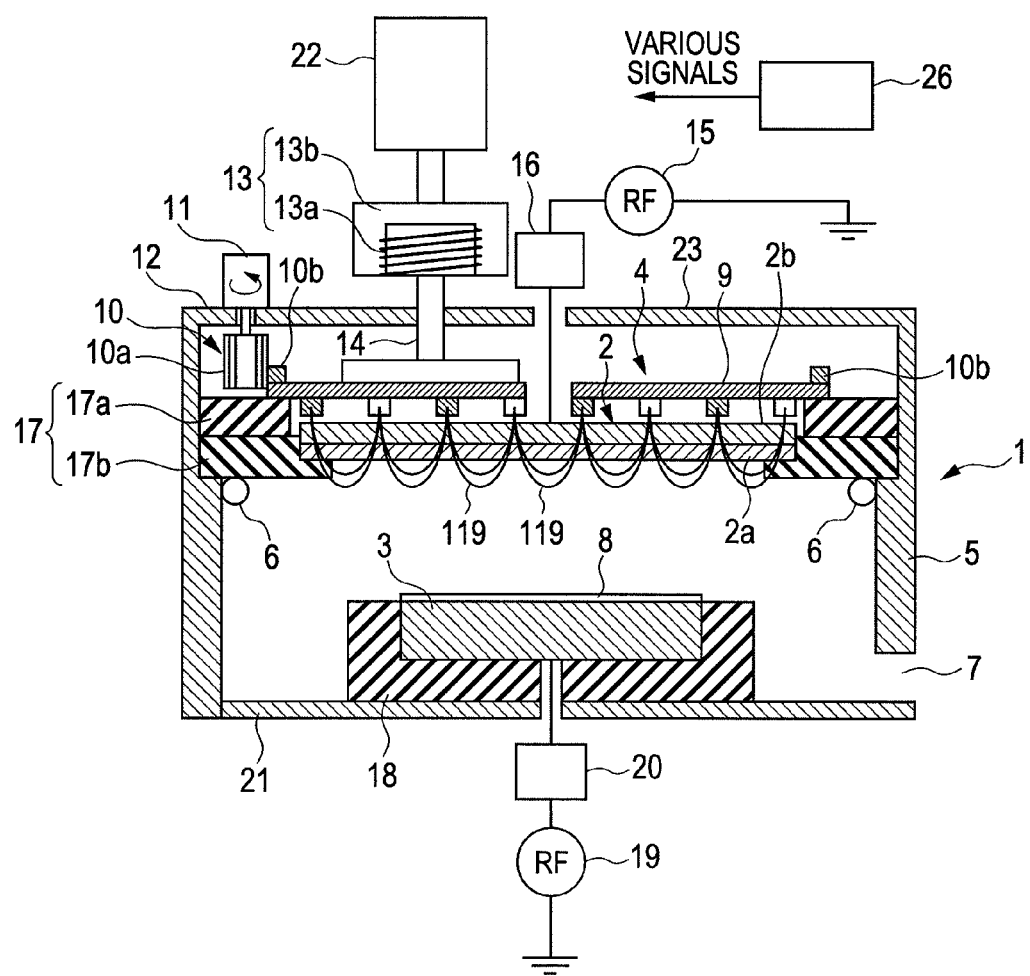
FIG. 1 is a schematic diagram of a sputter apparatus according to a first embodiment.

FIG. 1 shows a schematic diagram of a first embodiment. A sputter apparatus of FIG. 1 is one that generates a capacitive coupled plasma, and the sputter apparatus includes an upper electrode 2b, a lower electrode 3, a magnet apparatus 4, a cylindrical side wall 5, a gas introduction port 6, and an exhaust port 7 to be used to exhaust gas in a reaction container 1. The reaction container 1 is formed by the cylindrical side wall 5, a bottom plate 21, and a top plate 23.

A target member 2a is attached to the upper electrode 2b functioning as a cathode on the surface facing the lower electrode 3. The upper electrode 2b is made of, for example, aluminum. The diameter of the upper electrode 2b is selected according to the diameter of the substrate 8 to be processed. For example, when the diameter of the substrate 8 is 200 mm, the range of the diameter of the upper electrode 2b is set from 210 mm to 350 mm. The diameter of the target member 2a is equal to or smaller than the diameter of the upper electrode 2b. Although the thicknesses of the upper electrode 2b and the target member 2a are not limited in the present invention, the thicknesses are set to, for example, less than 10 mm so that the magnet apparatus 4 can form a strong magnetic field on the lower surface of the target member 2a (the surface facing the substrate 8). The target member 2a is not particularly limited in the present invention, and for example, made of a metal or alloy of such as Cu (copper), Al (aluminum), Ti (titanium), and Ta (tantalum), or a dielectric member such as $SiO_2$.

The upper electrode 2b and the target member 2a are disposed on a ring-shaped dielectric ring 17 formed by two members 17a and 17b so that the upper electrode 2b and the target member 2a are electrically insulated from the reaction container 1.

Figure 2:
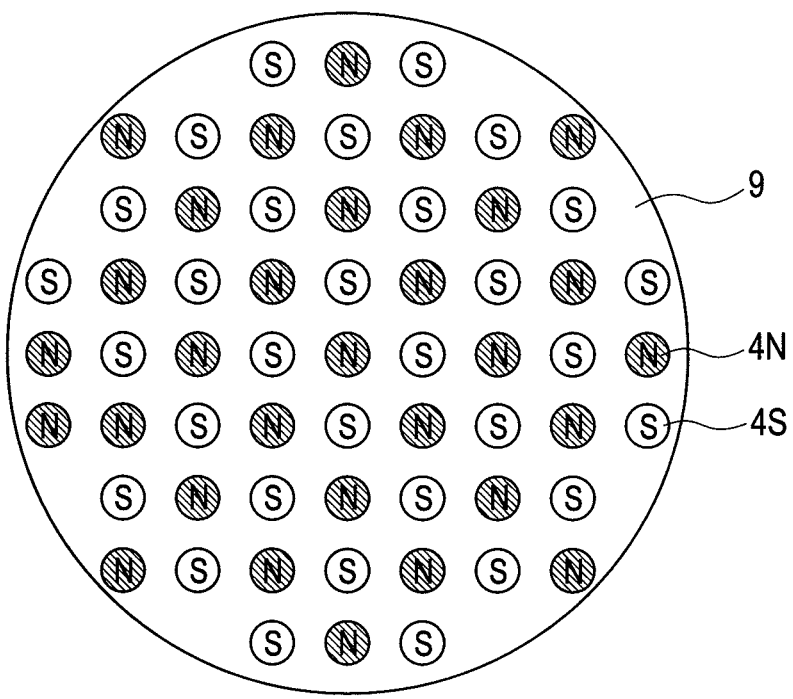
FIG. 2 is a plan view of a magnet apparatus viewed from a substrate.

The magnet apparatus 4 in FIG. 1 is a magnet apparatus that forms a point-cusp magnetic field. The magnet apparatus 4 is formed by arranging a plurality of magnets 4N and 4S on a metal sheet 9 having a plane shape larger than or equal to the target member 2a and configured to be able to form a magnetic field on the entire surface of the target member 2a. FIG. 2 is a plan view of the magnet apparatus 4 viewed from the substrate 8. In FIG. 2, the distance between any two magnets 4N and 4S adjacent to each other is the same. The magnets 4N and 4S are arranged so that the polarities facing the substrate 8 of the magnets 4N and 4S adjacent to each other are opposite to each other. Although the end surface of the magnets 4N and 4S is preferred to have a circular shape, it is not limited to this, but a magnet having an end surface of rectangular shape can also be used. The size of the magnets 4N and 4S and the distance and shape between the magnets are not particularly limited, and selected to obtain a desired magnetic flux density in accordance with the type of the target, each sizes of the substrate 8 and the reaction container 1, and the like. Normally, the diameter of the end surface of the magnets 4N and 4S is in a range of 5 mm to 50 mm, and the height of the magnets 4N and 4S is in a range of 5 mm to 50 mm. The distance between the magnets 4N and 4S is also not limited, and is selected depending on the necessary strength of the magnetic field on the lower surface of the target member 2a. The strength of the magnetic field on the lower surface of the target member 2a is shown by the magnetic field lines 119, and is set to be approximately 400 to 600 Gauss. However, this value of the magnetic field is not important and a different strength of the magnetic field can be used on the surface of the target member 2a.

The magnet apparatus 4 is connected to a rotation mechanism 10 for rotating the magnet arrangement around the center axis of the target member 2a in a direction around the surface of the target member 2a. Specifically, the rotation mechanism 10 comprises a first motor 11 and two gears 10a and 10b engaging with each other. The gear 10a is connected to the first motor 11 via an insulating rod 12. The gear 10b having a ring shape is fixed to an outer circumference of the metal sheet 9. A rotation force of the gear 10a is transferred to the gear 10b. In this way, by rotating the magnet arrangement, a uniform magnetic field is formed on the target member 2a and thus, the plasma density is uniform. The rotation speed of the magnet arrangement is not important, and for example, the rotation speed is in a range of 1 Hz to 100 Hz.

Moreover, the magnet apparatus 4 is also connected to an MT distance adjustment mechanism 30 that adjusts the distance between the magnet apparatus 4 and the target member 2a (hereinafter referred to as "MT distance"). In this embodiment, the MT distance adjustment mechanism 30 includes a second motor 22 and a connection member 13 that converts a rotation force of the second motor 22 into a linear movement. The connection member 13 includes an inner member 13a and an outer fixed member 13b screwing with the inner member 13a. By a rotation of the outer fixed member 13b connected to the second motor 22 which is fixed, the inner member 13a moves linearly, and thus the magnet apparatus 4 is driven via the insulating rod 14. It should be noted that the inner member 13a contains a bearing at a position connected to the insulating rod 14 and rotatably supports the magnet apparatus 4. It should also be noted that the adjustment range of the MT distance adjustment mechanism 30 depends on the configuration of the magnet apparatus 4 or the sputter apparatus, and for example, the adjustment range is variably set in a range of 0.1 mm to 50 mm.

Although, in FIG. 1, for simplicity of the figure, the insulating rod 14 is illustrated at a position away from the center of rotation of the magnet apparatus 4, actually the insulating rod 14 extends from the center of rotation. In the other figures, for simplicity of the figures, the detailed illustration of the MT distance adjustment mechanism 30 is omitted. The mechanisms of the rotation operation of the magnet arrangement and the adjustment operation of the MT distance are not limited to the example of FIG. 1.

The upper electrode 2b is connected to an RF power source 15 via a matching circuit 16. The frequency of the RF power source 15 is not important, and for example, the frequency can be set in a range of 10 MHz to 300 MHz. The upper electrode 2 may be connected to a DC power source at the same time in addition to the RF power source 15, and the DC power source may be used independently. The upper electrode 2b corresponds to the cathode of the present invention.

The lower electrode 3 is made of a metal. The lower electrode 3 is disposed on a dielectric member 18, so that the lower electrode 3 is insulated from the other parts of the reaction container 1. In a similar way, the lower electrode 3 is also connected to an RF power source 19 via a matching circuit 20. However, it is not necessary to supply an RF power to the lower electrode 3, and the RF power source 19 and the matching circuit 20 can be removed. The above-described substrate 8 is mounted on the lower electrode 3.

The side wall 5, the bottom plate 21, and top plate 23 that form the reaction container are made of a metal and are electrically grounded. There are some gas introduction ports 6 for supplying process gas inside the reaction container 1. When the RF power source 15 supplies the RF power to the upper electrode 2 in a low pressure condition, plasma is generated in a space above the substrate 8 in the reaction container 1 by a capacitive coupling mechanism. Electrons in the plasma perform cyclotron rotation by the presence of the magnetic field below the target member 2a. This increases the plasma density and basically confines the plasma in an area below the target member 2a. Once the plasma is generated, a negative self-bias voltage ($V_{DC}$) is generated on the target member 2a. By the voltage $V_{DC}$, ions in the plasma are accelerated toward the target member 2a, and thus the ions are urged toward the target member 2a. Collisions of the ions having high energies cause the sputtering of the target member 2a. When the voltage $V_{DC}$ is too low to urge the ions in order to obtain a sufficient sputtering speed, a negative DC bias may be applied to the target member 2a from a DC power source (not shown in the figures).

A control apparatus 26 controls various apparatuses to perform a film formation process by the sputtering in accordance with a predetermined process recipe. Specifically, in this embodiment, the control apparatus 26 drives the MT distance adjustment mechanism 30 to set the MT distance to a predetermined value. Furthermore, in this embodiment, the control apparatus 26 controls the power inputted from the RF power sources 15 and 19, the rotation operation of the magnet apparatus 4, the gas inflow amount, the gas exhaust velocity, and the like to predetermined values. The control apparatus 26 is configured to include, for example, an arithmetic processing unit such as a sequencer or a computer and a driver that converts data into electrical signals that can be outputted to various apparatuses.

Figure 3:
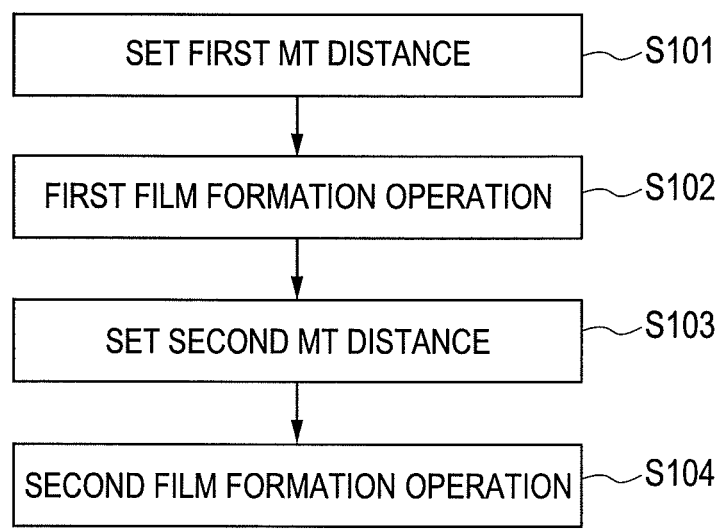
FIG. 3 is a diagram showing a film formation flow according to the first embodiment.

FIG. 3 shows a film formation flow of this embodiment performed by the control apparatus 26.

Figure 4A:
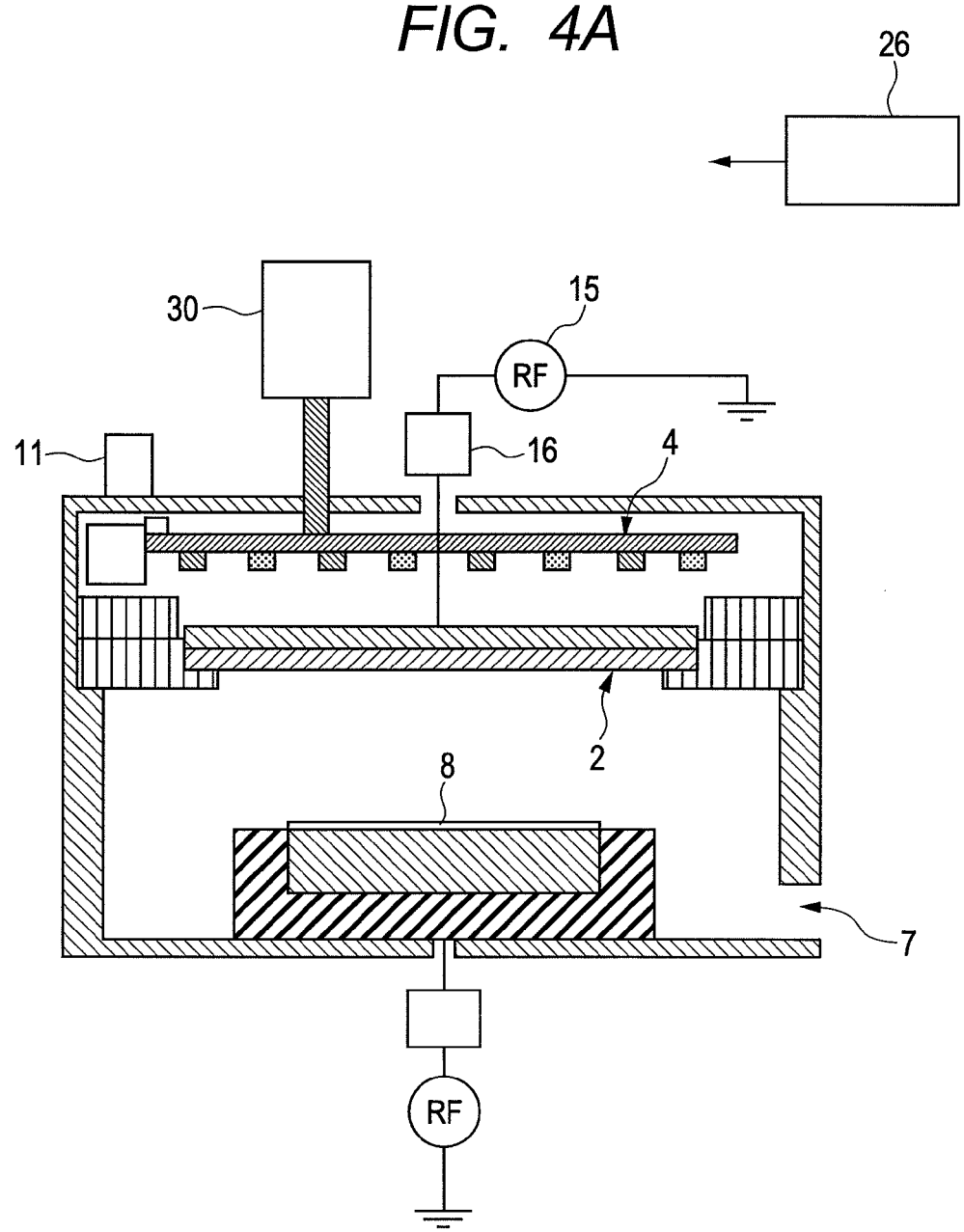
FIG. 4A is a diagram showing a modified example of an MT distance.

In this embodiment, in a state in which the magnet apparatus 4 is driven by the MT distance adjustment mechanism 30 and the MT distance is set to a first MT distance (step S101), an electric discharge is executed to perform a first film formation operation (step S102). The first MT distance at this time is, for example, a distance as shown in FIG. 4A by using a predetermined value.

Figure 4B:
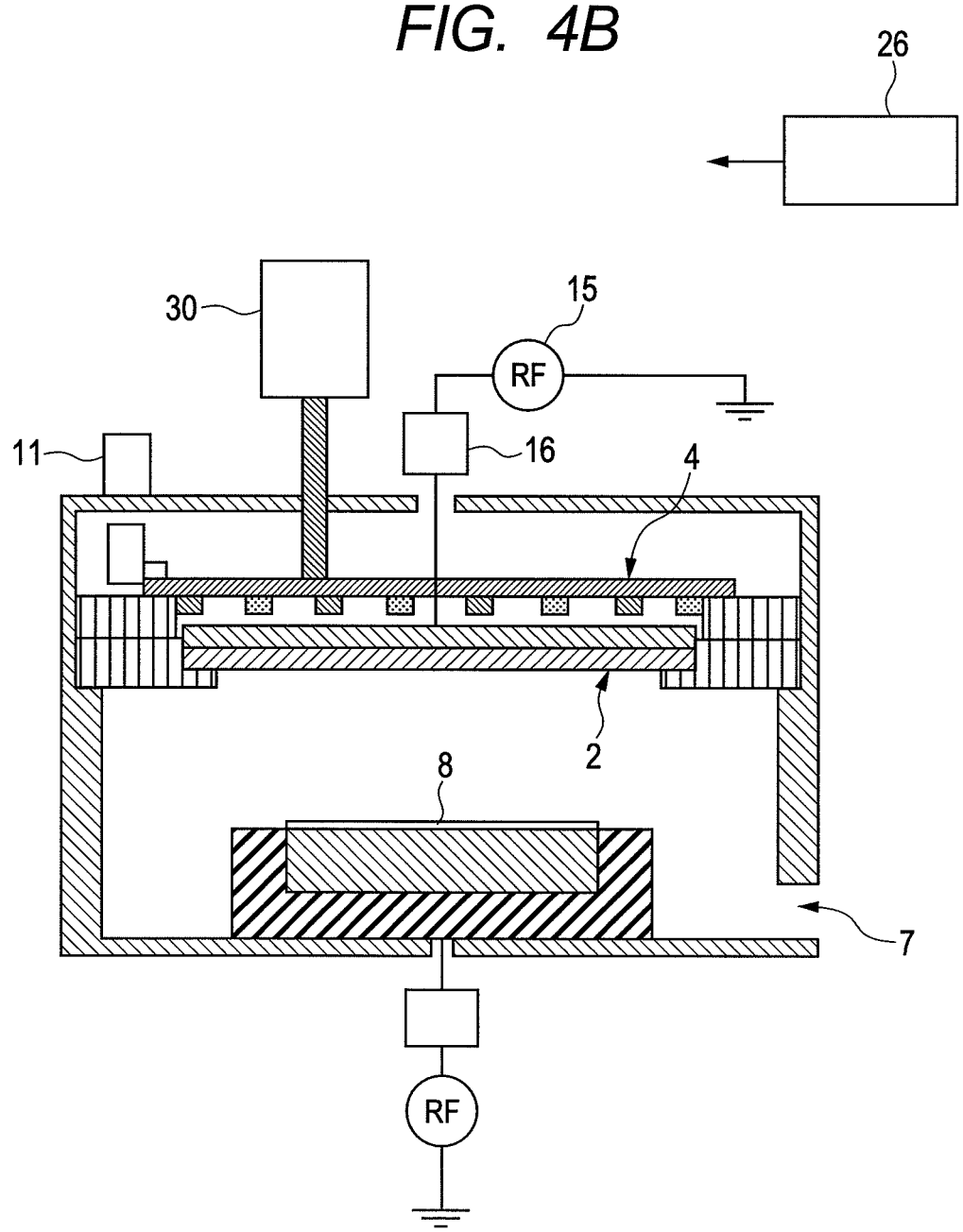
FIG. 4B is a diagram showing a modified example of the MT distance.

Next, the magnet apparatus 4 is driven by the MT distance adjustment mechanism and the MT distance is set to a second MT distance (step S103), and then an electric discharge is executed to perform a second film formation operation (step S104). In other words, while forming a single layer film, the MT distance is changed and two-step film formation is performed. For example, the second MT distance is set to a distance smaller than the first distance so that the magnet apparatus 4 and the target member 2a come close together as shown in FIG. 4B by using a predetermined value.

Figure 5A:
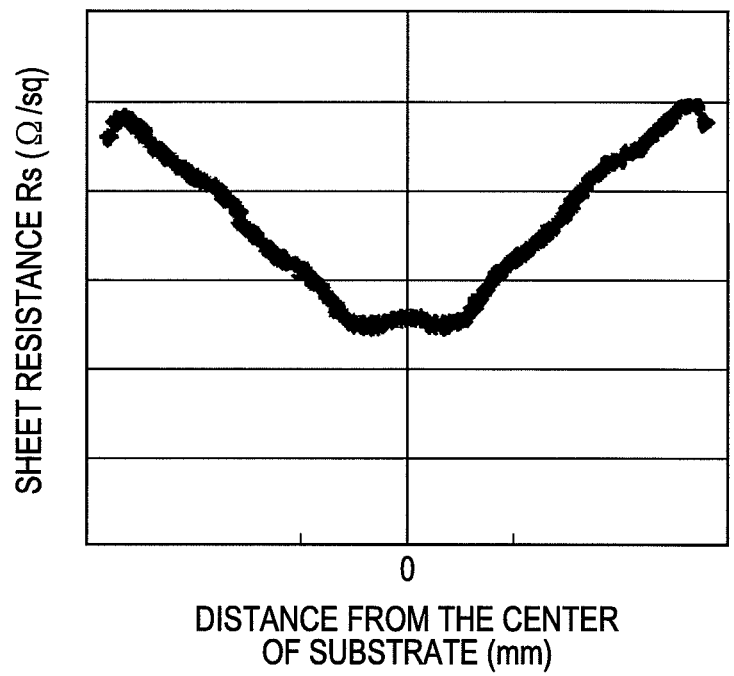
FIG. 5A is a graph showing sheet resistance distribution achieved by each set MT distance.
Figure 5B:
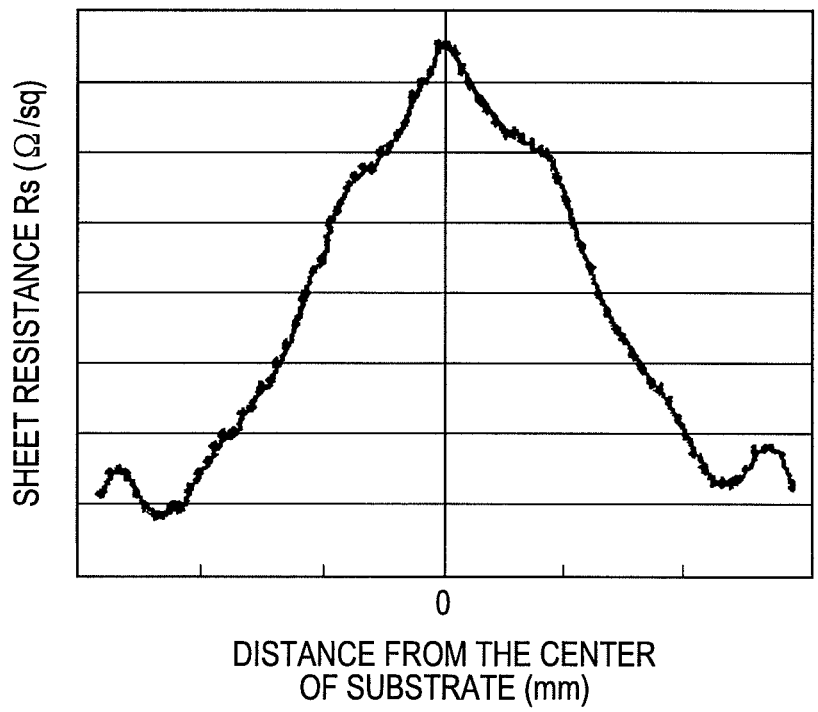
FIG. 5B is a graph showing sheet resistance distribution achieved by each set MT distance.

FIGS. 5A and 5B show an example of sheet resistance distribution (reciprocal of film thickness) of a thin film achieved by the first and the second MT distances. The sheet resistance distribution largely changes by the difference of the MT distances. When the MT distance is large, the sheet resistance distribution shows a valley shape in which the sheet resistance is small near the center of the substrate and the sheet resistance increases nearer the end portion, as is shown in FIG. 5A. On the other hand, when the MT distance is small, the sheet resistance distribution shows a chevron shape in which the sheet resistance is large near the center of the substrate and the sheet resistance decreases nearer the end portion, as is shown in FIG. 5B. In other words, both sheet resistance distributions have sheet resistance magnitudes inverse to each other at a corresponding position.

By setting MT distances that realize the sheet resistance distributions as shown in FIGS. 5A and 5B in one recipe, the distribution shapes including the valley shape and the chevron shape are cancelled and a totally flat distribution can be realized.

Figure 6:
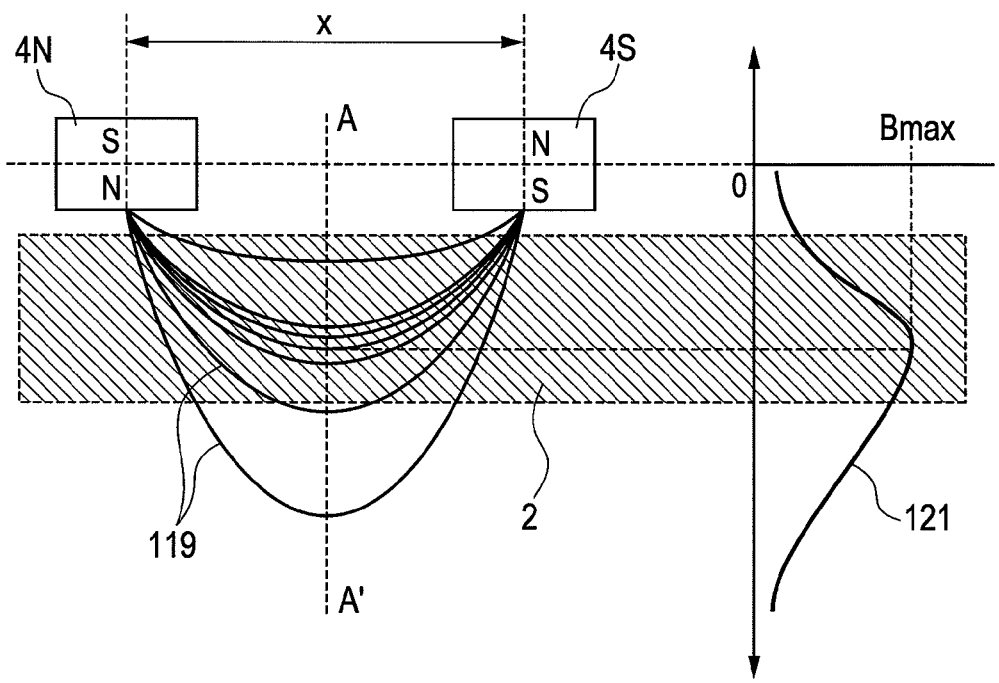
FIG. 6 is a diagram showing a state of a magnetic field formed by the magnet apparatus.

FIG. 6 shows a state of the magnetic field formed by the magnet apparatus 4.

The characteristic curve 121 on the right-hand side of the page shows a variation of the strength of the magnetic field of the magnetic flux 119 between two magnets 4N and 4S along A-A' line. As shown by the characteristic curve 121, the strength of the point-cusp magnetic field 119 gradually increases to the maximum value Bmax as the distance from the magnets 4N and 4S increases, and then the strength decreases as the distance from the bottom portions of the magnets 4N and 4S increases. The A-A' line is located near the center of the two magnets 4N and 4S, and a horizontal magnetic field acting on this portion from the two magnets 4N and 4S contributes to the confinement of the plasma. Therefore, the distribution of the plasma density formed near the target member 4a is two-dimensionally or three-dimensionally different depending on how far from the magnet apparatus 4 the target member 4a is disposed. Based on this, ion collision distribution on the target surface and emission angle distribution due to difference of incident angles vary, so that it is assumed that the variations cause the differences of the film formation distribution.

Therefore, as shown in FIGS. 4A and 4B, when forming a predetermined thin film by the sputtering method, it is possible to improve the sheet resistance distribution (as well as the film thickness distribution) of the thin film by using different MT distances twice or more. At this time, even when the MT distances are different, if the distribution tendencies are the same and only the magnitude of the difference of film formation characteristics of each portion is different, for example, if only the heights of the chevron shapes of the chevron distributions are different, it is difficult to obtain the effect. Therefore, the second distance is set which forms a film formation distribution in which at least a part of biases of the film formation distribution can be cancelled with respect to the film formation distribution of the first MT distance. Such an MT distance can be arbitrarily set by a process recipe made by a sequencer or a PC. By specifying the setting values by using results of experiments that previously checked the differences of distributions which vary depending on differences of target materials or the like, it is possible to obtain an optimal film formation distribution for various target materials and largely reduce development time and condition deliberation time.

Second Embodiment

Next, a second embodiment of the present invention will be explained.

Figure 7:
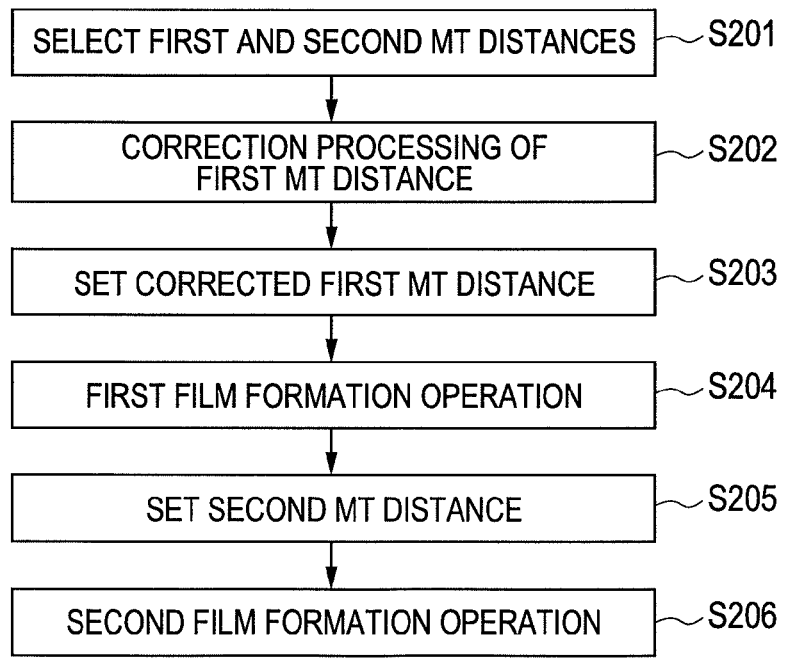
FIG. 7 is a diagram showing a film formation flow according to a second embodiment.

FIG. 7 shows a flow of the control apparatus 26 according to the second embodiment. In the second embodiment, the configuration of the sputter apparatus is substantially the same as that of the first embodiment except that the flow is different.

In this embodiment, first, after selecting the first and the second MT distances (step S201), a correction is performed on this value according to a surface state of the target (step S202). The values obtained in step S201 are, for example, values set regardless of the change over time of the target. However, for example, the thickness of the target member 2a decreases (erosion) by 1 mm for each 50-hour operation, so that, even when the MT distance is the same, the magnetic flux formed on the surface varies depending on the depth of the erosion, and thus the film formation distribution varies. Therefore, in this embodiment, the degree of progress of the erosion is obtained, and the first MT distance is corrected in accordance with the degree of progress of the erosion (step 202).

The method for obtaining the degree of progress of the erosion is not particularly limited. In this embodiment, the erosion speed (the degree of progress of the erosion per unit time) is previously obtained by an experiment, and the degree of progress of the erosion is calculated on the basis of the erosion speed and the accumulation time of the film formation. The MT distance is increased by a value corresponding to the degree of progress of the erosion so that the magnetic field on the surface of the target member 2a is substantially constant throughout the life time (useful life) of the target member. How much the MT distance is adjusted is determined by a map or an arithmetic expression in advance.

After the correction processing, the first film formation operation is performed by using the first MT distance obtained by the correction (steps S203 and S204), and the second film formation operation is performed by using the second MT distance (steps S205 and S206). Based on this, the shape of the film formation distribution does not vary along with the progress of the erosion and the shape of the film formation distribution is maintained until the so-called target life, which is a state in which the target has been fully used. Furthermore, as a result, there is a technical advantage of the plasma density and the sputtering speed based on the plasma density becoming constant as the time passes.

Third Embodiment

Next, a third embodiment will be explained.

Figure 8:
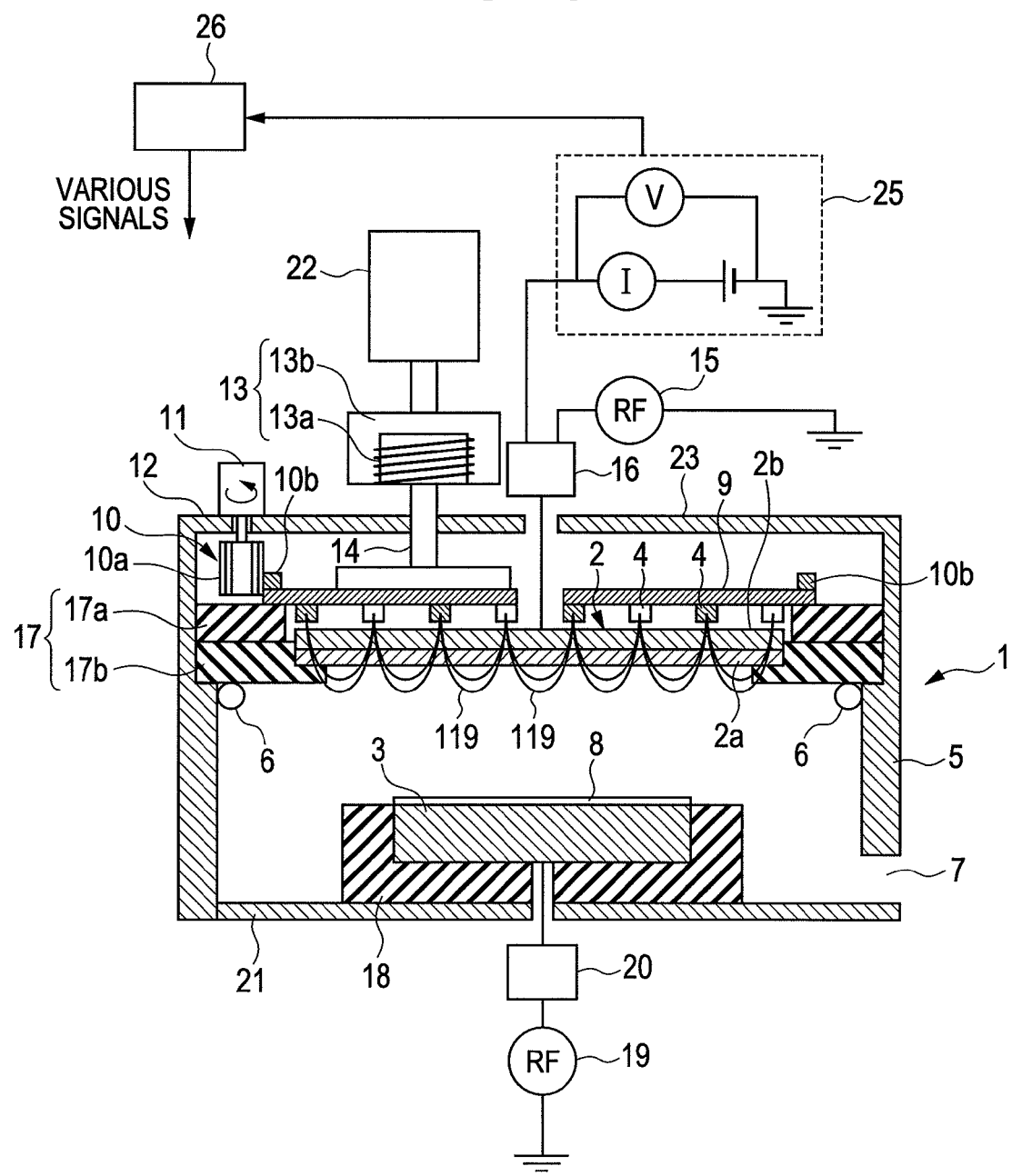
FIG. 8 is a schematic diagram of a sputter apparatus according to a third embodiment.

FIG. 8 shows an outline of the sputter apparatus according to the third embodiment. The sputter apparatus according to the third embodiment has substantially the same configuration as that of the first embodiment except that the sputter apparatus according to the third embodiment includes a DC power source for supplying power to perform electric discharge along with the RF power source and a monitor circuit 25 contained in the DC power source. The film formation flow by the control apparatus 26 is the same as the flow shown in FIG. 7.

In this embodiment, the monitor circuit 25 measures current and voltage on the surface of the target member 2a and outputs the measurement values to the control apparatus 26. The control apparatus 26 performs the correction processing (step S202 in FIG. 7) of the MT distance on the basis of the measurement results. The monitor circuit 25 in the DC power source can measure current and voltage flowing through the electrode potion, and by measuring these current and voltage, the monitor circuit 25 measures the current and voltage on the surface of the target member 2a. The control apparatus 26 calculates the degree of progress of the erosion on the basis of the current and voltage on the surface of the target member 2a, and corrects the MT distance on the basis of the calculation result. The correspondence relationship between the current and voltage on the surface of the target member 2a and the degree of progress of the erosion is defined in advance by a map or the like. The correction may be performed on the basis of the electric power.

Based on this, in the same way as in the second embodiment, the shape of the film formation distribution is maintained throughout the target life.

As mentioned above, although the second and the third embodiments have been described, the correction method is not limited to these. It should be noted that, when the electric discharge is performed by using only the RF power, it is possible to similarly calculate the degree of progress of the erosion by measuring the monitored values such as Vpp and Vdc included in the RF monitor circuit.

Although, in the above embodiments, the first MT distance is the same during the first film formation operation, the correction may be performed during the first film formation operation so that the magnetic field formed on the surface of the target member 2a is substantially constant.

Furthermore, although, in the second and the third embodiments, the MT distance is corrected so that the film formation distribution pattern is substantially the same regardless of the erosion, the combination of the distribution patterns may be changed according to the degree of progress of the erosion. For example, in accordance with the change of the film formation distribution pattern by the first film formation operation according to the progress of the erosion, to cancel the change, the distribution pattern of the film formation by the second film formation operation is changed. When the method for changing the MT distance is used as described above, the magnetic field formed on the target member 2a, the plasma density, and the sputtering speed can be substantially the same at each time.

In addition, although, in the second and the third embodiments, the degree of progress of the erosion is estimated and the correction is performed on the basis of the estimation, the MT distance may be set to realize a film formation distribution pattern in which biases of the film formation distribution patterns are cancelled each other in response to estimating the plasma density or the like.

Figure 9:
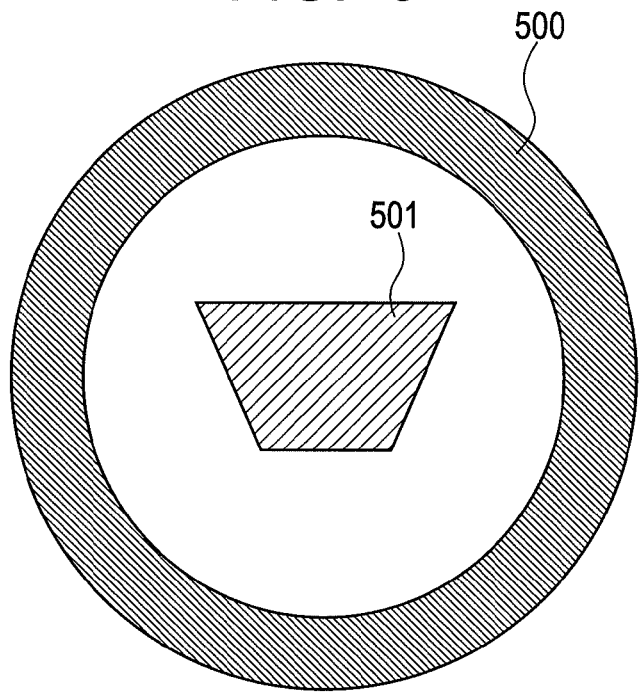
FIG. 9 is a diagram showing another example of the magnet apparatus.

Furthermore, although, in the above-described embodiments, the magnet apparatus 4 that forms a point-cusp magnetic field is used, it is not limited to this, and there is essentially no problem in using a magnet having a closed loop shape as shown in FIG. 9. Moreover, the circumference magnet 500 has a magnetic property different from that of the center magnet 501, and the polarities of these magnets are not limited to N or S. In addition, the detailed dimensions and the distance between the magnets are determined to achieve an optimal shape as a plasma source, and the values thereof are not limited.

Next, an operation example of the present invention will be explained.

Figure 10:
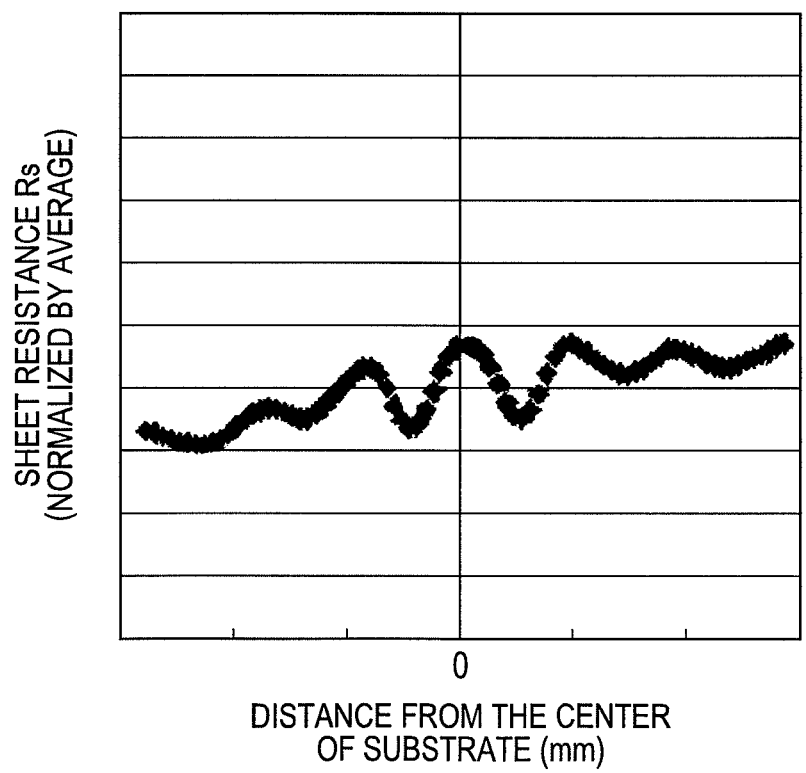
FIG. 10 is a graph showing sheet resistance distribution of an example.

The film formation is performed by using the sputter apparatus as shown in FIG. 1 and applying a high-frequency power 4000 W and a DC voltage 400 V to the upper electrode 2b. In this case, the MT distance is set to 20 mm in the first film formation operation, the MT distance is set to 17 mm (the first MT distance −3 mm) in the second film formation operation, and the film formation is performed for 60 seconds each time. In this case, the sheet resistance distribution in the first film formation operation is shown in FIG. 5A and the sheet resistance distribution in the second film formation operation is shown in FIG. 5B. After the entire film formation, as shown in FIG. 10, the biases of both distributions are cancelled and a uniform distribution is obtained.

The film formation time can be arbitrarily set in accordance with a film formation rate of each film formation operation and the shape of the film formation distribution.

The invention claimed is:

1. A sputtering apparatus comprising:
    a processing chamber in which a body to be processed can be disposed;
    a cathode to which a target can be attached on a side where the body to be processed is disposed;
    a magnet apparatus that is located on a side of the cathode opposite to the side where the target is attached and forms a point-cusp magnetic field on a surface of the target;
    a drive means capable of adjusting a distance between the magnet apparatus and the cathode;
    a rotation mechanism configured to rotate the magnet apparatus around a center axis of the target; and
    a control means configured to control the drive means and a power supply to the cathode, storing first information including a first distance between the magnet apparatus and the target which makes a film thickness distribution on the body to be processed be a chevron-shaped pattern in which film thickness is largest near a center of the body to be processed and film thickness gradually decreases toward an end of the body to be processed, and storing second information including a second distance different from the first distance between the magnet apparatus and the target which makes a film thickness distribution on the body to be processed be a valley-shaped pattern in which film thickness is smallest near a center of the body to be processed and film thickness gradually increases toward an end of the body to be processed, wherein the magnet apparatus includes a plurality of magnets distributed and placed in a grid shape on a flat sheet facing the cathode, each magnet has a magnetic pole in a direction perpendicular to the cathode surface and the magnets are arranged so that adjacent magnets have polarities opposite to each other, and the drive means is configured to integrally move the magnet apparatus, and wherein, while the rotation mechanism rotates the magnet apparatus, the control means controls the drive means to perform:

a first control, on a basis of the first information, for setting a distance between the magnet apparatus and the target to the first distance and forming a film of the chevron-shaped pattern on the body to be processed by sputtering of the target; and a second control after performing the first control, on a basis of the second information, for setting a distance between the magnet apparatus and the target to the second distance, and forming a film of the valley-shaped pattern on the body to be processed by sputtering of the target, and wherein the valley-shaped pattern when the film is formed in the second distance is a pattern in which a magnitude of film thickness is inverse to that of the chevron-shaped pattern when the film is formed in the first distance in at least a part of the body to be processed.

2. A sputtering apparatus according to claim 1, wherein the control means includes a correction unit configured to correct the first distance in accordance with a degree of progress of erosion on the target.

3. A sputtering method on a body to be processed in a sputtering apparatus including a cathode, a magnet apparatus which is located on a back side of the cathode opposite to a front side where a target is attached and forms a point-cusp magnetic field on a surface of the target, a drive means capable of adjusting a distance between the magnet apparatus and the cathode, and a rotation mechanism configured to rotate the magnet apparatus around a center axis of the target, comprising:

a first step of obtaining first information including a first distance between the magnet apparatus and the target which makes a film thickness distribution on the body to be processed be a chevron-shaped pattern in which film thickness is largest near a center of the body to be processed and film thickness gradually decreases toward an end of the body to be processed, and second information including a second distance different from the first distance between the magnet apparatus and the target which makes a film thickness distribution on the body to be processed be a valley-shaped pattern in which film thickness is smallest near a center of the body to be processed and film thickness gradually increases toward an end of the body to be processed;

a second step of, on a basis of the first information, positioning the magnet apparatus on the back side of the cathode at the first distance from the target to form a magnetic field on a surface of the target, and forming a film of the chevron-shaped pattern on the body to be processed by sputtering of the target, while the rotation mechanism rotates the magnet apparatus; and a third step of, on a basis of the second information, positioning the magnet apparatus on the back side of the cathode at the second distance from the target, and forming a film of the valley-shaped pattern on the body to be processed by sputtering of the target, while the rotation mechanism rotates the magnet apparatus, wherein the magnet apparatus includes a plurality of magnets distributed and placed in a grid shape on a flat sheet facing the cathode, each magnet has a magnetic pole in a direction perpendicular to the cathode surface and the magnets are arranged so that adjacent magnets have polarities opposite to each other, and the drive means integrally moves the magnet apparatus, and wherein the valley-shaped pattern when the film is formed in the second distance is a pattern in which a magnitude of film thickness is inverse to that of the chevron-shaped pattern when the film is formed in the first distance in at least a part of the body to be processed.

4. A sputtering method according to claim 3, wherein the first distance is corrected in accordance with a surface state of the target and the magnet apparatus is positioned at the corrected first distance.

5. A sputtering apparatus according to claim 2, wherein the correction unit comprises a monitor circuit configured to measure current and voltage on a surface of the target and output a result of the measurement, and a calculation means configured to calculate the degree of progress of erosion on a basis of the result of the measurement by the monitor circuit and correcting the first distance on a basis of the calculation.

6. A sputtering apparatus according to claim 1, wherein the control means includes a program causing the sputtering apparatus to execute a process comprising:

a step of obtaining the first and second distances;

a step of correcting the first distance in accordance with a degree of progress of erosion on the target;

a step of setting a distance between the magnet apparatus and the target to the corrected first distance;

a step of performing a first film formation operation using the corrected first distance;

a step of setting a distance between the magnet apparatus and the target to the second distance; and a step of performing a second film formation operation using the second distance.

7. A sputtering method according to claim 3, further comprising, before the second step, a step of correcting the first distance in accordance with a degree of progress of erosion on the target, wherein the magnet apparatus is positioned at the corrected first distance from the target in the second step.

8. A sputtering apparatus comprising:

a processing chamber in which a body to be processed can be disposed;

a cathode to which a target can be attached on a side where the body to be processed is disposed;

a magnet apparatus which is located on a side of the cathode opposite to the side where the target is attached and forms a point-cusp magnetic field on a surface of the target;

a drive means capable of adjusting a distance between the magnet apparatus and the cathode;

a rotation mechanism configured to rotate the magnet apparatus around a center axis of the target; and a control means configured to control the drive means and a power supply to the cathode, storing first information including a first distance between the magnet apparatus and the target which makes a film thickness distribution on the body to be processed be a valley-shaped pattern in which film thickness is smallest near a center of the body to be processed and film thickness gradually increases toward an end of the body to be processed, and storing second information including a second distance different from the first distance between the magnet apparatus and the target which makes a film thickness distribution on the body to be processed be a chevron-shaped pattern in which film thickness is largest near a center of the body to be processed and film thickness gradually decreases toward an end of the body to be processed, wherein the magnet apparatus includes a plurality of magnets distributed and placed in a grid shape on a flat sheet facing the cathode, each magnet has a magnetic pole in a direction perpendicular to the cathode surface and the magnets are arranged so that adjacent magnets have polarities opposite to each other, and the drive means is configured to integrally move the magnet apparatus, and wherein, while the rotation mechanism rotates the magnet apparatus, the control means controls the drive means to perform:

a first control, on a basis of the first information, for setting a distance between the magnet apparatus and the target to the first distance, and forming a film of the valley-shaped pattern on the body to be processed by sputtering of the target; and a second control after performing the first control, on a basis of the second information, for setting a distance between the magnet apparatus and the target to the second distance, and forming a film of the chevron-shaped pattern on the body to be processed by sputtering of the target, and wherein the chevron-shaped pattern when the film is formed in the second distance is a pattern in which a magnitude of film thickness is inverse to that of the valley-shaped pattern when the film is formed in the first distance in at least a part of the body to be processed.

* * * * *